United States Patent

[11] 3,560,809

[72] Inventor Hajime Terakado
Kodaira-Shi, Japan
[21] Appl. No. 802,845
[22] Filed Feb. 27, 1969
[45] Patented Feb. 2, 1971
[73] Assignee Hitachi, Ltd.
Tokyo, Japan
a corporation of Japan
[32] Priority Mar. 4, 1968
[33] Japan
[31] 43/13623

[54] VARIABLE CAPACITANCE RECTIFYING JUNCTION DIODE
4 Claims, 6 Drawing Figs.

[52] U.S. Cl. ........ 317/234, 317/235
[51] Int. Cl. ........ H01l 9/00
[50] Field of Search ........ 317/234, 237—241, 234/31, 234/48.1

[56] References Cited

UNITED STATES PATENTS

| | | | |
|---|---|---|---|
| 3,041,509 | 6/1962 | Belmont et al. | 317/235 |
| 3,290,127 | 12/1966 | Kahng et al. | 317/234X |
| 3,349,297 | 10/1967 | Crawell et al. | 317/234 |
| 3,394,289 | 7/1968 | Lindmayer | 317/235 |
| 3,451,912 | 6/1969 | D'Heurle et al. | 204/192 |
| 3,476,984 | 11/1969 | Tibol | 317/234 |

*Primary Examiner*—James D. Kallam
*Attorney*—Craig, Antonelli, Stewart & Hill

ABSTRACT: A variable capacitance diode comprising a super abrupt junction therein, said diode comprising a semiconductor wafer including a semiconductor region having a graded impurity concentration, and a metal layer deposited on one surface of said semiconductor region to form a surface barrier at said one surface of the semiconductor region.

PATENTED FEB 2 1971 3,560,809

INVENTOR

HAJIME TERAKADO

BY Craig, Antonelli; Stewart & Hill

ATTORNEYS

VARIABLE CAPACITANCE RECTIFYING JUNCTION DIODE

BACKGROUND OF THE INVENTION

1. Field of the Invention

This invention relates to a variable capacitance element having a surface barrier junction formed at the contact surface of a semiconductor body and a metal layer, which works as junction capacitance, and more particularly to a variable capacitance element having a super abrupt junction.

2. Description of the Prior Art

A semiconductor variable capacitance element employing a super abrupt junction wherein the concentration of the impurity forming a PN junction in the semiconductor substrate varies abruptly or stepwise at the junction surface and the concentration of the P- or N-type impurity forming the PN junction decreases with the distance from the junction surface is well known as a variable capacitance element the capacitance of which varies greatly with a variation in voltage.

Conventionally, in a variable capacitance element of this type, a super abrupt PN junction is formed in a semiconductor wafer by the epitaxial deposition technique or the diffusion technique. However, since high accuracy is required in a variable capacitance element for the thickness, area and impurity concentration distribution of the PN junction forming a super abrupt junction, it has been very difficult to make a desired super abrupt junction by these techniques on an industrial basis.

Further, it is required for this variable capacitance element to increase the ratio of P- and N-type impurity concentrations to make the barrier of the super abrupt PN junction high. If the barrier of this PN junction is low the variation in the capacitance becomes small when operated with low voltages. Thus, the effective operative range is limited at low voltage region.

SUMMARY OF THE INVENTION

The purpose of this invention is to provide a variable capacitance element which can produce a desired capacitance variation with low voltages.

Another object of this invention is to provide a variable capacitance element having a super abrupt junction, which can be produced on an industrial basis.

According to this invention, there is provided a variable capacitance element comprising a semiconductor wafer including a region in which the concentration of impurity decreases with the distance from one surface of the region, and a metal layer being in contact with said one surface of the region of the semiconductor wafer, a super abrupt junction being formed by the surface barrier (Schottky barrier) junction made by the contact of the semiconductor and the metal, and by the graded impurity concentration in said semiconductor region.

Other objects and features of this invention will be apparent from the following description made in connection with the drawing.

DESCRIPTION OF THE PREFERRED EMBODIMENTS

Figure 1:
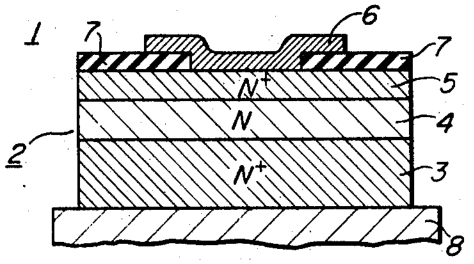
FIG. 1 shows a cross section of an embodiment of a variable capacitance element according to this invention.

FIG. 1 shows a variable capacitance element 1 which comprises a wafer 2 of N-type silicon semiconductor material comprising a first low resistivity region 3, a high resistivity region 4 contiguous to the region 3, and a second low resistivity region 5 contiguous to the region 4, and a metal layer 6 deposited on the surface of the wafer 2. The impurity concentration in the second low resistivity region 5 decreased from the surface of the wafer 2 to the interface with the region 4. The metal layer 6 deposited on this region 5 forms a surface barrier at the surface of the region 5. As seen in FIG. 1, a silicon oxide coating 7 is deposited on the surface of the wafer 2 except the region where the metal layer 6 contacts with the wafer 2 to prevent contamination of the silicon wafer due to ambient atmosphere. On the other surface of the wafer 2, a metal layer 8 is provided on the region 3 to form an electrode of the element 1, making ohmic contact with the region 3.

Figure 4A:
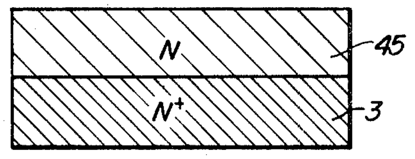
FIGS. 4a to 4c show cross sections of the semimanufactured and completed variable capacitance element shown in FIG. 1.

A typical process of making such a variable capacitance element as shown in FIG. 1 will be explained hereinbelow referring to FIGS. 4a to 4c. First, an N-type silicon substrate 3 of low resistivity, i.e. 0.001 to 0.01 Ω-cm., and having a thickness of 100 to 200$\mu$ is prepared. Then, a semiconductor layer 45 of high resistivity (1 to 50 Ω-cm.) is formed by the well known epitaxial deposition technique (see FIG. 4a). The thickness of this semiconductor layer 45 is selected to be approximately equal to the sum of the thicknesses of the layers 4 and 5 of FIG. 1, and preferably is 2 to 5$\mu$. When the thickness of this semiconductor layer 45 is too large, the series impedance of the completed variable capacitance element will become so large that it affects the electrical properties of the element.

Figure 4B:
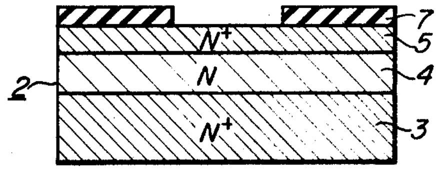

Next, a diffused 127 5 is formed in the epitaxial layer 45 by the well known diffusion technique (see FIG. 4b). For example, this diffused layer 5 is made to have a thickness of 0.5 $\mu$and a resistivity of 0.2 Ω-cm. at the surface. The resistivity of the layer 5 at the surface should lie within the range of from about 0.1 to about 1 Ω-cm. at the surface. The resistivity of the layer 5 at the surface should lie within the range of from about 0.1 to about 1 Ω-cm. In order to form a surface barrier with the metal layer 6 to be deposited on the layer 5 in a following step and to produce a desired gradient in impurity concentration. In other words, the above resistivity should be equal to or more than 10 times the resistivity of the substrate 3 with which the electrode 8 makes ohmic contact. It is evident that the impurity concentration is in this diffused layer decreases as it approaches the epitaxial layer 4.

Next, a silicon oxide film 7 is produced at the surface portion of the wafer 2 and a hole is engraved at the central portion thereof employing the well known photoresist and etching techniques (see FIG. 4b ) . This oxide film 7 may be constituted by the oxide film produced in the process of forming the diffused layer 5 or may be made thermally as is well known.

Figure 4C:
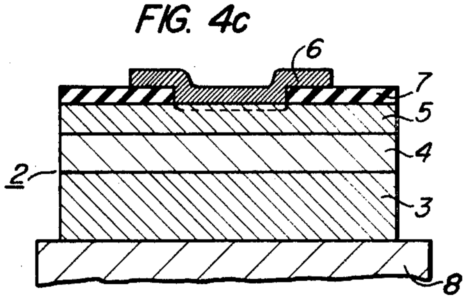

After providing the hole through the oxide film 7, a metal layer is deposited on the layer 5 in the hole (see FIG. 4c). This deposition is carried out by introducing tungsten hexachloride $WCl_6$ to the surface of the wafer with hydrogen carrier gas and thermally decomposing tungsten hexachloride This thermal decomposition is achieved by heating the wafer 2 at a temperature of 800° to 1,200° C., but preferably at a temperature below 1,000° C. not to disturb the grading of the impurity concentration in the diffused layer 5. The deposited tungsten layer 6 reacts with silicon of the semiconductor region 5 at the surface portion thereof to form a thin film of tungsten silicide $WSi_2$, as is shown by the dotted line in FIG. 4c, which forms a surface barrier with N-type silicon of the region 5. Being different from the usual Schottky barrier by the metal-to-silicon contact, this silicide-to-silicon surface barrier has a silicide layer between metal and silicon and thus eliminates the possibility of deterioration in characteristics. Further, since the silicide layer is hard and epitaxially grown continuously from the silicon wafer, it affords the provision of a mechanically harder deposition of the metal layer 6.

Molybdenum is also useful for the formation of such metal silicide layer. Since the halide of molybdenum decomposes at a temperature of about 500° C., it enables the deposition of the metal layer 6 without disturbing the predetermined impurity concentration gradient in the diffused layer 5.

Either of these two metals is especially effective for the reaction with N-type silicon semiconductor to form a metal silicide layer so as to form a stable barrier Further. sine since the work function of these metal silicides is higher than that of the simple substances. the barrier between the metal layer 6 and the silicon semiconductor 5 is made higher by inserting this silicide layer therebetween. Therefore, a variable capacitance element employing a silicide layer of these metals has a higher reverse breakdown voltage.

Alternatively, chromium, titanium, tantalum, nickel or vanadium can be used as metal for the metal layer 6. The work functions of these metals becomes smaller when it forms silicide, therefore with these metals it is desirable to form the metal layer 6 at a temperature at which the metal does no not react with silicon to form the silicide thereof. These metals are deposited on the diffused layer 5 for example by the evaporation and deposition technique, without heating the semiconductor wafer 2. Thus, the metal layer 6 is made so as to contact with the diffused layer 5 and form a surface barrier without forming a silicide layer.

After the formation of the metal layer 6, a lead wire (not shown) is connected to the metal layer 6 and an electrode 8 is brought into contact with the lower surface of the wafer 2 to complete the element. Here, the electrode 8 is made of a gold-plated iron substrate or the like and ohmically contacts with the semiconductor region 3 having a remarkably high impurity concentration, forming eutectic of gold and silicon.

Figure 2:
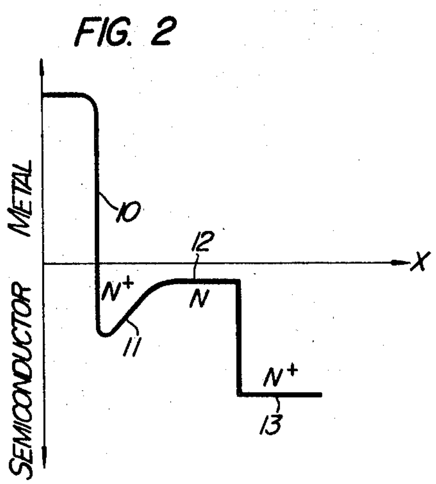
FIG. 2 shows a graph for illustrating a variable capacitance element obtained according to this invention.

Such a variable capacitance element manufactured as above has a super abrupt junction as can be seen from FIG. 2 showing the conductivity curve of the element 1, wherein the element comprises a junction 10 of the surface barrier formed at the contacting interface of the metal layer 6 and the semiconductor region 5, and impurity concentration distributions 11, 12 and 13 produced in the semiconductor regions 5,4 and 3 respectively.

When a voltage is applied across this variable capacitance element having a super abrupt junction with the metal layer 6 kept at a negative potential and the electrode 8 at a positive potential, the junction capacitance varies with the voltage applied thereacross. The depletion layer produced at the junction portion by the application of a voltage does not extend into the metal layer 6 but only in the direction to the interior of the semiconductor region 5, therefore variation in the capacitance increases with the voltage applied thereacross and also is large even with a low voltage. Thus a variable capacitance element as described above is very effective when operated with a low voltage source.

According to this invention, since the junction of a variable capacitance element is constituted by a surface barrier between metal and semiconductor, it is not necessary to heat the wafer to a high temperature when forming the rectifying junction. Therefore, a super abrupt junction can be formed without disturbing the predetermined grading of the impurity concentration formed in the wafer beforehand. The barrier thus formed at the surface of the semiconductor wafer exhibits a more effective function than that of a PN junction barrier obtainable in a semiconductor substrate by the conventional epitaxial and/or diffusion technique.

Figure 3:
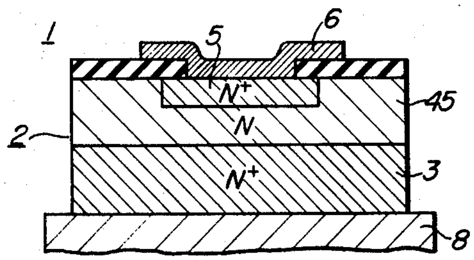
FIG. 3 shows a cross section of another embodiment of a variable capacitance element according to this invention.

Further, the diffused layer 5 may also be formed only in a selected portion of the epitaxial layer 45 as is shown in FIG. 3. The alternation in the manufacturing process will be apparent to those skilled in the art.

Although the invention has been described on preferred embodiments, it is not restricted to these, and various modifications and alternations are possible within the scope an and spirit of the invention.

I claim:

1. A variable capacity element comprising:

a semiconductor substrate of one conductivity type having a pair of opposed major surfaces, said substrate including a first semiconductor region extending to one of said major surfaces, a second semiconductor region extending to the other of said major surfaces and a third semiconductor region interposed between said first and second semiconductor regions, the impurity concentration in said first semiconductor region decreasing from said one major surface to the interface with said third semiconductor region, the resistivity of said third semiconductor region being higher than that of the portion of said first semiconductor region adjacent to said third semiconductor region, the resistivity of said second semiconductor region being lower than that of said third semiconductor region; and an electrode disposed on said one major surface and forming a rectifying surface barrier said first semiconductor region.

2. The element according to claim 1, wherein said substrate is of N-type silicon crystal, and said electrode comprises at least a metal selected from the group consisting of chromium, titanium, tantalum, nickel and vanadium.

3. The element according to claim 1, wherein said substrate is of N-type silicon crystal, and said electrode comprises a metal layer including a metal selected from the group consisting of tungsten and molybdenum and a thin silicide layer of silicon and said metal interposed between said metal layer and said first semiconductor region forming a rectifying surface barrier with the substrate.

4. A semiconductor device comprising:

a semiconductor substrate of high conductivity silicon:

a semiconductor layer of high resistivity silicon, said layer having the same conductivity type as that as of said substrate and being formed in contact with said substrate;

a diffused region of silicon material formed in contact with said semiconductor layer and spaced from said substrate, the thickness of the layer between said diffused region and said substrate being in the range of from 1.5 $\mu$ to 4.5 $\mu$said diffused region being of the same conductivity type as that of said substrate, the impurity concentration in the diffused region decreasing in the direction toward said semiconductor layer and being higher than that of a said semiconductor at the interface with said semiconductor layer;

an insulating layer covering said diffused region and having a hole;

a silicide layer formed in a said hole in said insulating layer and forming a rectifying surface barrier with said diffused region, said silicide layer including a metal selected from the group consisting of tungsten and molybdenum; and an electrode connected to said silicide layer through said holes in said insulating layer.